United States Patent
Cauchy (10) Patent No.: US 8,166,283 B2
(45) Date of Patent: Apr. 24, 2012

(54) GENERATOR OF A SIGNAL WITH AN ADJUSTABLE WAVEFORM

(75) Inventor: Xavier Cauchy, Laval (FR)

(73) Assignee: STMicroelectronics S.A., Montrouge (FR)

( * ) Notice: Subject to any disclaimer, the term of this patent is extended or adjusted under 35 U.S.C. 154(b) by 108 days.

(21) Appl. No.: 11/502,343

(22) Filed: Aug. 10, 2006

(65) Prior Publication Data

US 2007/0038878 A1 Feb. 15, 2007

(30) Foreign Application Priority Data

Aug. 11, 2005 (FR) ...................... 05 52495

(51) Int. Cl.
*G06F 15/00* (2006.01)
*G06F 7/38* (2006.01)
*G06F 9/00* (2006.01)
*G06F 9/44* (2006.01)
*G06F 1/00* (2006.01)

(52) U.S. Cl. ........................ 712/220; 713/500
(58) Field of Classification Search ............... 345/440.1; 713/500
See application file for complete search history.

(56) References Cited

U.S. PATENT DOCUMENTS

| | | | | |
|---|---|---|---|---|
| 3,662,160 A | * | 5/1972 | Hoppes | 708/270 |
| 4,064,423 A | * | 12/1977 | Atkisson, Jr. | 708/272 |
| 4,222,108 A | | 9/1980 | Braaten | |
| 4,707,797 A | * | 11/1987 | Briggs | 708/8 |
| 5,963,200 A | * | 10/1999 | Deering et al. | 345/213 |
| 6,742,071 B1 | * | 5/2004 | Boynton et al. | 710/305 |
| 2004/0054834 A1 | * | 3/2004 | Devins et al. | 710/260 |

OTHER PUBLICATIONS

French Search Report from French Patent Application 05/52495, filed Aug. 11, 2005.

* cited by examiner

*Primary Examiner* — Aimee Li
*Assistant Examiner* — George Giroux
(74) *Attorney, Agent, or Firm* — Wolf, Greenfield & Sacks, P.C.

(57) ABSTRACT

A generator of a signal including a memory in which instructions are stored, each instruction including a code portion and an argument portion; circuitry for successively reading instructions stored in the memory; decoding circuitry capable of receiving, for each read instruction, the code portion of the instruction and of providing an activation signal which depends on the code portion; and circuitry for providing the signal capable of receiving, for each read instruction, the argument portion of the instruction and capable, according to the activation signal, of storing the argument portion and of providing the signal equal to the argument portion or of providing the signal equal to the previously-stored argument portion.

15 Claims, 3 Drawing Sheets

GENERATOR OF A SIGNAL WITH AN ADJUSTABLE WAVEFORM

BACKGROUND OF THE INVENTION

1. Field of the Invention

The present invention relates to a generator of a digital or analog signal with an adjustable waveform.

2. Discussion of the Related Art

For certain applications, it is desirable to have a generator of a digital or analog signal with a waveform that is adjustable according to needs. Such a generator may be used to provide synchronization pulses included in an analog video signal and which are especially used to control the passing from the end of the display of an image line to the beginning of the display of the next line and the passing from the end of the display of an image to the beginning of the display of the next image. Such a generator may also be used to provide specific digital messages intended to be inserted in a digital data flow, such as for example end of active video or start of active video signals EAV or SAV. Such messages are for example present in a digital video data flow defined according to standard ITUR-656.

A first conventional example of a digital signal generator provides a memory in which are stored all the signal values. The signal is then obtained by successively reading the values stored in the memory. To obtain an analog signal, it is then enough to convert the obtained digital signal via a digital-to-analog converter. If the memory is a RAM (random access memory), such a signal generator may provide signals of any form by modifying the values stored in the memory. Such a signal generator is generally used to provide signals of very simple form, for example, periodic signals of short period and is conventionally used for the provision of a sinusoidal signal. However, as soon as the signal to be provided is relatively complex, the number of values to be stored in the memory becomes very high, requiring use of a RAM of large dimensions and of high cost.

A second conventional example of a digital signal generator implements a state machine, for example formed by a dedicated circuit, each state corresponding to the provision of a value of the desired signal. By making the transitions between states dependent on parameters which can be modified, it is possible to change the waveform of the obtained signal. Such a state machine is, for example, used for the provision of analog video signal synchronization pulses which have different waveforms according to video signal standards. However, the flexibility of a state machine is limited since all the states and all the transitions between states likely to be of interest must have been provided before forming of the state machine. For example, the parameters enabling modifying the transitions between states may be determined to enable provision of different types of synchronization pulses according to existing standards. However, a new standard may take the lead, which requires synchronization pulses of different shape that cannot be obtained with the same state machine. Further, a state machine generally corresponds to a complex dedicated circuit, the design of which is difficult and the proper operation of which cannot easily be exhaustively verified.

SUMMARY OF THE INVENTION

The present invention aims at a generator of a digital signal (or analog, after digital-to-analog conversion) with an adjustable waveform, of relatively simple design and at least partly integratable with a small bulk.

According to another object of the present invention, the provision of signals of different waveforms can be obtained with no modification of the structure of the circuit forming the generator.

To achieve all or part of these objects, as well as others, the present invention provides a generator of a signal comprising a memory in which instructions are stored, each instruction comprising a code portion and an argument portion; means for successively reading instructions stored in the memory; decoding means capable of receiving, for each read instruction, the code portion of the instruction and of providing an activation signal which depends on the code portion; and means for providing said signal capable of receiving, for each read instruction, the argument portion of the instruction and capable, according to the activation signal, of storing the argument portion and of providing said signal equal to the argument portion or of providing said signal equal to the previously-stored argument portion.

According to an example of embodiment of the present invention, the instructions are stored in the memory at locations each associated with an address, the generator comprising address provision means, the read means being capable of successively reading the instructions stored at the locations associated with the provided addresses, the decoding means being capable, for each read instruction, of providing the means of successive address provision with control signals which depend on the code portion of the read instruction, the successive address provision means being capable of providing the next address according to the control signals.

According to an example of embodiment of the present invention, the memory is a single-port RAM and the successive address provision means are capable of providing a write authorization signal which depends on the control signals, the generator comprising means for providing at least one write address and one instruction to be written and arbitration means capable of receiving the authorization signal and the write address and of authorizing an operation of writing of the instruction to be written into the memory at the location associated with the write address when the authorization signal is at a determined value.

According to an example of embodiment of the present invention, the decoding means are capable of receiving the authorization signal and of ignoring the code portion of the instruction to be written when the authorization signal is at the determined value.

According to an example of embodiment of the present invention, the successive address provision means are capable of receiving at least one event signal and, for determined control signals, of providing the next address when the event signal is at a determined value.

According to an example of embodiment of the present invention, the means for providing said signal comprise a multiplexer controlled by the activation signal and capable of receiving, at a first input, the argument portion of the read instruction and, at the second input, said signal; and an additional memory connected to the output of the multiplexer and providing said signal.

The present invention also provides a method of provision of a signal by a generator comprising a memory in which are stored instructions, each instruction comprising a code portion and an argument portion. The method comprises the steps of successively reading instructions from the memory; providing, for each read instruction, an activation signal which depends on the code portion of the read instruction; and, according to the activation signal, storing the argument portion of the read instruction and providing said signal equal to the argument portion or providing said signal equal to the previously-stored argument portion.

According to an example of embodiment of the present invention, the instructions are stored in the memory at locations each associated with an address, the method comprising a repeating of the steps of providing an address; reading the instruction from the memory at the location associated with the address; providing, for each read instruction, control signals which depend on the code portion of the read instruction; and determining the next address to be provided according to the control signals.

According to an example of embodiment of the present invention, the method further comprises the steps of, for each read instruction, providing an authorization signal based on the code portion of the read instruction; and authorizing an operation of writing into the memory when the authorization signal is at a determined value.

According to an example of embodiment of the present invention, the address is provided on reception of at least one event signal at a determined value.

The foregoing and other objects, features, and advantages of the present invention will be discussed in detail in the following non-limiting description of specific embodiments in connection with the accompanying drawings.

DETAILED DESCRIPTION

For clarity, the same elements have been designated with the same reference numerals in the different drawings.

The present invention comprises the provision of a signal generator comprising a memory in which is stored, not the succession of values of the signal to be provided, but a "description" of the way to "plot" the signal to be provided. This is obtained by using a programming language adapted to the description of the signals and comprising a limited number of instructions.

Almost all the signals used in current electronic circuits comprise portions of constant value and portions which repeat several times. The programming language according to the present invention takes into account such characteristics and enables describing most of the signals with a small number of instructions. It comprises at least instructions enabling:

specifying a digital value to be provided;

maintaining the specified digital value for a determined time;

maintaining the specified digital value until occurrence of a determined event; and repeating a portion of the already-provided signal.

The present invention provides storing in the memory the instructions describing the signal to be provided in the form of digital data of L+M bits, where the L most significant bits form a signal op_code representative of the actual instruction and the M least significant bits form a signal arg which may be used by the instruction.

The instructions, and the actions resulting therefrom, of an example of a programming language according to the present invention will now be described. For each instruction, an identifier (coded by signal op_code) has been indicated in capital letters.

Instruction "SET arg" corresponds to the provision of an output signal at value arg. Instruction "RPLSET arg" corresponds, like instruction SET, to the provision of an output signal at value arg. Further, the address of this instruction becomes a reference address for a next instruction REPLAY. Instruction "RPTSET arg" corresponds, like instruction SET, to the provision of an output signal at value arg. Further, the address of this instruction becomes a reference address for a next instruction REPEAT. Instruction "SKIP arg" corresponds to the maintaining for arg operating cycles of the current value at the output. Instruction "STOP" corresponds to the maintaining of the current value at the output until occurrence of a first determined event, for example corresponding to the reception of a signal hsync. Instruction "REPLAY arg" corresponds to the waiting for the occurrence of the first determined event,. for example corresponding to the reception of signal hsync, to repeat arg times the instruction sequence from the address of the last instruction RPLSET. Instruction "REPEAT arg" corresponds to the repeating, arg times, of the instruction sequence from the address of last instruction RPTSET. Instruction "HOLD" corresponds to the holding of the current value at the output until occurrence of a second determined event for example corresponding to the reception of a signal vsync. Instruction "JUMP arg" still appears as a pair of successive instructions "JUMP arg1" and "JUMP arg2". Instruction "JUMP arg1" causes a jump to address instruction arg1 and instruction "JUMP arg2" causes a return to the instruction which follows instruction "JUMP arg2" when the instruction at address arg2 is reached. For such an instruction set, signal op_code may be coded over 4 bits (even over 3 bits by using a bit of signal arg to differentiate two identical signals op_code). Signal arg is for example coded over 10 bits. According to the considered instruction, not all the bits of the corresponding signal arg are necessarily used.

Figure 1:
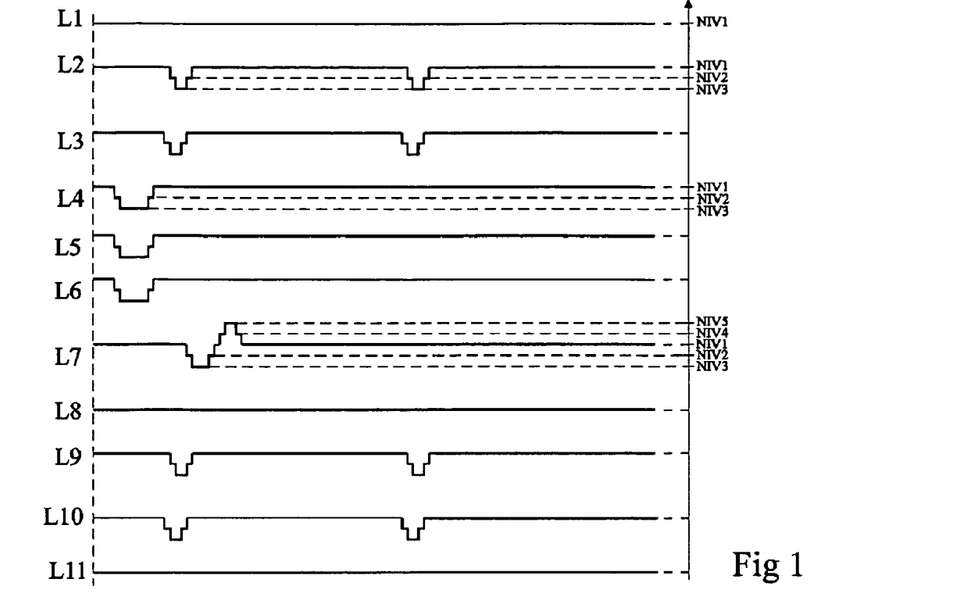
FIG. 1 shows an example of a signal capable of being provided by a signal generator according to the present invention.

FIG. 1 shows an example of a signal capable of being provided by the signal generator according to the present invention. Said signal for example is a video synchronization signal associated with an image of 11 lines L1 to L11. The passing from one line to another is associated with the reception of a signal hsync by the signal generator and the passing from the last line of an image to be displayed to the first line of the next image is associated with the reception of a signal vsync by the signal generator.

With the previously-described instructions, the program enabling provision of the signal shown in FIG. 1 is the following:

| Memory address of the instruction | Instruction | Screen line | Description |
|---|---|---|---|
| Address1 | SET NIV1 | L1 | Sets the signal to NIV1 |
| Address2 | STOP | L1 | Waits until the next signal hsync |
| Address3 | RPLSET NIV1 | L2 | Sets the signal to NIV1 and sets a reference for the next instruction REPLAY |
| Address4 | SKIP 28 | L2 | Maintains the signal at NIV1 for 29 more cycles |
| Address5 | RPTSET NIV2 | L2 | Sets the signal to NIV2 and sets a reference for the next instruction REPEAT |
| Address6 | SET NIV3 | L2 | Sets the signal to NIV3 |
| Address7 | SKIP 5 | L2 | Maintains the signal at NIV3 for 6 more cycles |
| Address8 | SET NIV2 | L2 | Sets the signal to NIV2 |
| Address9 | SET NIV1 | L2 | Sets the signal to NIV1 |
| Address10 | SKIP 88 | L2 | Maintains the signal at NIV1 for 89 more cycles |
| Address11 | REPEAT 1 | L2 | Repeats the sequence from Address5 once |
| Address12 | REPLAY 1 | L3 | Repeats the sequence from Address3 once on reception of a signal hsync |
| Address13 | RPLSET NIV1 | L4 | Sets the signal to NIV1 and sets a reference for the next instruction REPLAY |
| Address14 | SKIP 8 | L4 | Maintains the signal at NIV1 for 9 more cycles |
| Address15 | SET NIV2 | L4 | Sets the signal to NIV2 |
| Address16 | SET NIV3 | L4 | Sets the signal to NIV3 |
| Address17 | SKIP 10 | L4 | Maintains the signal at NIV3 for 10 more cycles |
| Address18 | SET NIV2 | L4 | Sets the signal to NIV2 |
| Address19 | SET NIV1 | L4 | Sets the signal to NIV1 |
| Address20 | REPLAY 2 | L5-L6 | Repeats the sequence from Address13 on reception of signal hsync, for the next two hsync |
| Address21 | SET NIV1 | L7 | Sets the signal to NIV1 |
| Address22 | SKIP 10 | L7 | Maintains the signal at NIV1 for 11 more cycles |
| Address23 | SET NIV2 | L7 | Sets the signal to NIV2 |
| Address24 | SET NIV3 | L7 | Sets the signal to NIV3 |
| Address25 | SKIP 7 | L7 | Maintains the signal at NIV3 for 8 more cycles |
| Address26 | SET NIV2 | L7 | Sets the signal to NIV2 |
| Address27 | SET NIV1 | L7 | Sets the signal to NIV1 |
| Address28 | SET NIV4 | L7 | Sets the signal to NIV4 |
| Address29 | SET NIV5 | L7 | Sets the signal to NIV5 |
| Address30 | SKIP 5 | L7 | Maintains the signal at NIV5 for 6 more cycles |
| Address31 | SET NIV4 | L7 | Sets the signal to NIV4 |
| Address32 | SET NIV1 | L7 | Sets the signal to NIV1 |
| Address33 | STOP | L7 | Waits until the next signal hsync |
| Address34 | JUMP Address1 | L8-L10 | Sends back to the instruction at Address1 |
| Address35 | JUMP Address11 | L8-L10 | After the instruction at Address11 return to the instruction at Address36 |
| Address36 | SET NIV1 | L11 | Sets the signal to NIV1 |
| Address37 | HOLD | L11 | Waits until the next signal vsync |

Figure 2:
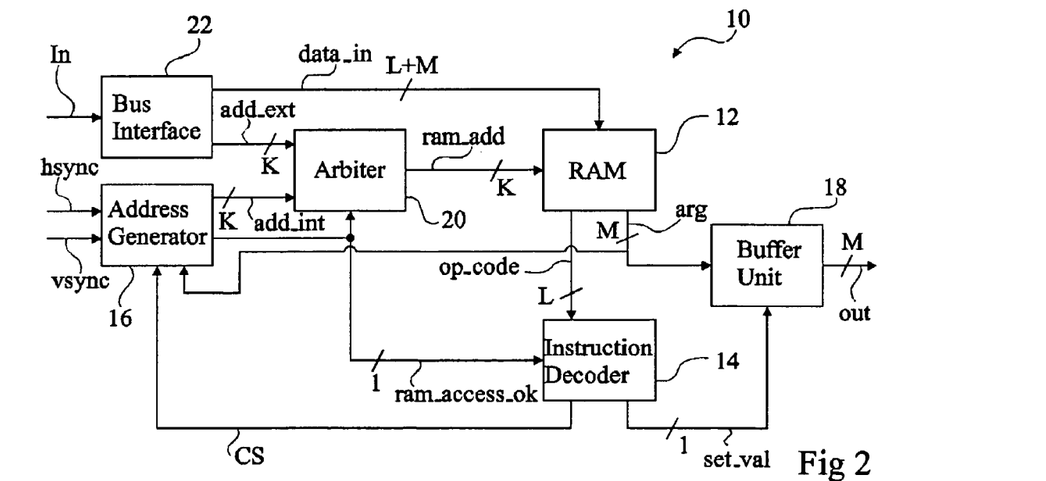
FIG. 2 schematically shows an example of the forming of a signal generator according to the present invention.

FIG. 2 shows an example of the forming of a generator 10 according to the present invention capable of providing a digital signal out having M bits. Generator 10 comprises a RAM 12, for example, a single-port RAM. Memory 12 comprises N locations, each location being associated with a specific address ram_add coded over K bits (N being equal to the K-th power of 2). As an example, for the storage of the sequence of previously-described instructions, K may be equal to 6 bits. In each location of memory 12 may be stored an instruction over M+L bits, for example corresponding to one of the previously-described instructions. For each instruction read from memory 12 at a given address, the L most significant bits, forming signal op_code, are provided to an instruction decoder 14, which provides control signals CS to an address generator 16. Simultaneously, for each instruction, the M least significant bits, forming signal arg, are provided to address generator 16 and to a buffer unit 18 which provides signal out. Buffer unit 18 is controlled by a signal set_val provided by decoding unit 14. Address generator 16 receives event signals hsync and vsync and provides an arbiter 20 with a signal add_int representative of an address in memory 12.

The writing of data into memory 12 is performed via a bus interface unit 22 receiving a signal In and providing arbiter 20 with a signal add_ext representative of an address in memory 12 and a signal data_in corresponding to an instruction to be stored in memory 12. Address generator 16 provides a signal ram_access_ok to arbiter 20 and to decoding 14 indicating whether a write operation can be performed in the memory. Arbiter 20 provides an address signal ram_add to memory 12, which corresponds to one or the other of address signals add_ext or add_int according to signal ram_access_ok.

The operation of generator 10 according to the present invention is the following. The instruction sequence describing the signal to be obtained is stored in memory 12 via interface unit 22. For the provision of the desired signal, address generator 16 successively provides addresses in memory 12. According to each read instruction, decoding unit 14 enables or not buffer unit 18 to modify the value of signal out and controls address generator 16 for the provision of the next address in memory 12. More specifically, if signal op_code corresponds to an instruction which modifies the value of output signal out (for example, instructions SET, RPTSET, and RPLSET), then decoding unit 14 controls buffer unit 18, via signal set_val, so that signal out is equal to signal arg received by buffer unit 18. Buffer unit 18 then also stores signal out. If signal op_code corresponds to an instruction that does not modify the value of output signal out (for example, instructions SKIP, HOLD, STOP, JUMP, REPEAT, and REPLAY), then decoding unit 14 controls buffer unit 18, via signal set_val, so as not to take into account the signal arg that it receives. Signal out then is maintained at the last value stored by buffer unit 18.

Figure 3:
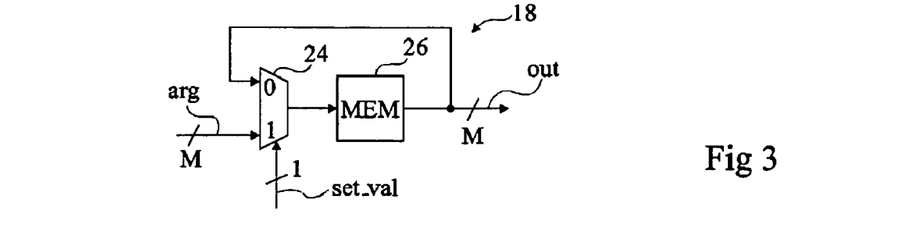
FIG. 3 shows a more detailed example of an element of the signal generator of FIG. 2.

FIG. 3 shows a more detailed example of buffer unit 18. Buffer unit 18 comprises a multiplexer 24, controlled by signal set_val, having an input receiving signal arg and having its other input receiving signal out. The output of multiplexer 24 is provided to a memory 26 (MEM), for example, formed of flip-flops, which provides signal out. When signal set_val is, for example, at a high state (corresponding to logic value "1"), the output of multiplexer 24 corresponds to signal arg, and signal out is equal to the signal arg received by multiplexer 24. When signal set_val is, for example, at a low state (corresponding to logic value "0"), the output of multiplexer 24 corresponds to signal out, that is, to the last signal stored in memory 26.

Address generator 16 comprises three counters which will be called hereafter skip_counter, replay_counter, and repeat_counter. Further, address generator 16 comprises four memories called hereafter jump_to, jump_from, repeat_label, and replay_label, in which are stored specific addresses in memory 12. Signal generator 10 also comprises a memory, not shown, in which are stored operating parameters of signal generator 10. It may for example be the size of counters skip_counter, replay_counter, and repeat_counter and memories jump_to, jump_from, repeat_label, and replay_label.

Figure 4:
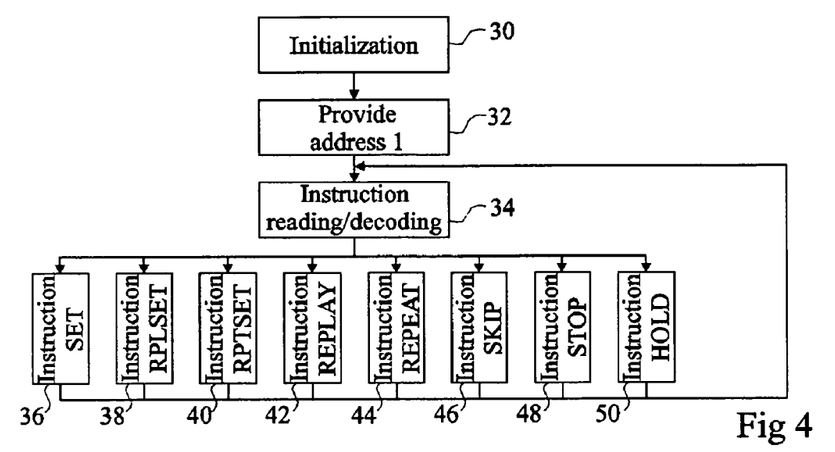
FIG. 4 illustrates the steps of an example of a method of provision of a signal by the signal generator according to the present invention.

FIG. 4 illustrates the steps of an example of a method of provision of a signal by signal generator 10 of FIG. 1. After, it will be considered that address generator 16 increments the read address when it provides a new read address hich designates the instruction which normally follows the instruction stored at the read address previously provided in the sequence of instructions stored in memory 12.

At step 30, address generator 16 is initialized. Counters skip_counter, replay_counter, and repeat_counter are set to zero.

At step 32, address generator 16 provides arbiter 20 with a signal add_int corresponding to the read address in memory 12 designating the first instruction to be read of the instruction sequence stored in memory 12.

At step 34, arbiter 20 controls an operation for reading from memory 12 the instruction stored at the read address provided by address generator 16. Signal op_code, that is, the L most significant bits of the instruction read from memory 12 at the read address, is provided to decoding unit 14. According to whether signal op_code corresponds to instruction SET, RPLSET, RPTSET, REPLAY, REPEAT, SKIP, STOP, or HOLD, secondary methods 36, 38, 40, 42, 44, 46, 48, and 50 described hereafter are carried out. Each of the secondary methods results in the provision of a new read address by address generator 16. The method then starts again at step 34 until the last instruction of the sequence of instructions stored in memory 12 is executed.

Figure 5:
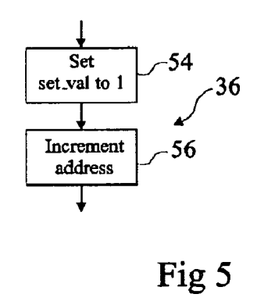
FIGS. 5 to 12 illustrate steps of secondary methods implemented by the method of signal provision by the signal generator according to the present invention.

FIG. 5 illustrates the steps of the secondary method 36 associated with instruction SET.

At step 54, decoding unit 14 sets signal set_val to 1. Signal out provided by buffer unit 18 thus corresponds to signal arg of the instruction read from memory 12.

At step 56, address generator 16 increments the read address and provides a new signal add_int to arbiter 20 and the method carries on at step 34.

Figure 6:
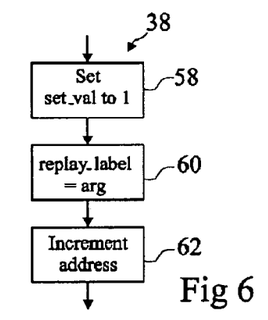

FIG. 6 illustrates the steps of secondary process 38 associated with instruction RPLSET.

At step 58, decoding unit 14 sets signal set_val to 1. The signal out provided by buffer unit 18 thus corresponds to signal arg of the instruction read from memory 12.

At step 60, address generator 16 writes into memory replay_label the current read address.

At step 62, address generator 16 increments the read address and provides a new signal add_int to arbiter 20 and the method carries on at step 34.

Figure 7:
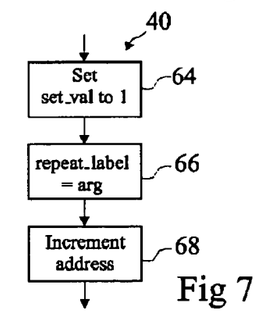

FIG. 7 illustrates the steps of secondary method 40 associated with instruction RPTSET.

At step 64, decoding unit 14 sets signal set_val to 1. Signal out provided by buffer unit 18 thus corresponds to signal arg of the instruction read from memory 12.

At step 66, address generator 16 writes into memory repeat_label the current read address.

At step 68, address generator 16 increments the read address and provides a new signal add_int to arbiter 20 and the method carries on at step 34.

Figure 8:
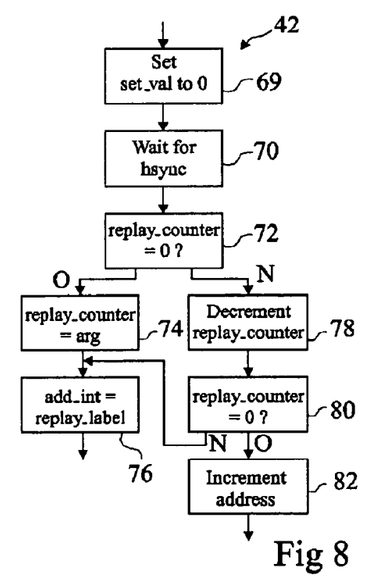

FIG. 8 illustrates the steps of secondary process 42 associated with instruction REPLAY.

At step 69, decoding unit 14 sets signal set_val to 0. Signal out provided by buffer unit 18 thus corresponds to the last signal arg stored by buffer unit 18.

At step 70, address generator 16 is inactive until reception of signal hsync. On reception of signal hsync, the method carries on at step 72.

At step 72, address generator 16 determines whether counter replay_counter is at zero. If so, the method carries on at step 74.

At step 74, address generator 16 writes signal arg (or only the "data" bits thereof) into counter replay_counter.

At step 76, address generator 16 provides a new signal add_int to arbiter 20 equal to the content of memory replay_label. The method carries on at step 34.

If at step 72, counter replay_counter is not zero, the method carries on at step 78.

At step 78, address generator 16 decrements the content of counter replay_counter.

At step 80, address generator 16 determines whether counter replay_counter is at zero. If not, the method carries on at step 76. Otherwise, the method carries on at step 82.

At step 82, address generator 16 increments the read address and provides a new signal add_int to arbiter 20 and the method carries on at step 34.

Figure 9:
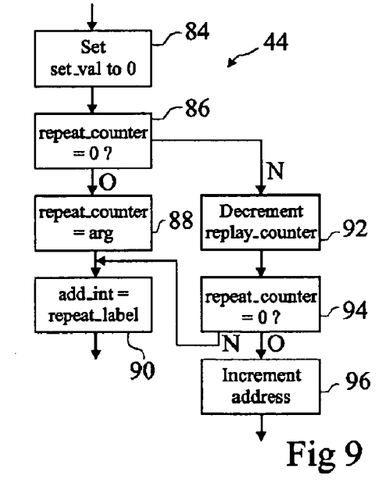

FIG. 9 illustrates the steps of secondary process 44 associated with instruction REPEAT.

At step 84, decoding unit 14 sets signal set_val to 0. Signal out provided by buffer unit 18 thus corresponds to the last signal arg stored by buffer unit 18.

At step 86, address generator 16 determines whether counter repeat_counter is at zero. If so, the method carries on at step 88.

At step 88, address generator 16 writes signal arg (or only the "wanted" bits thereof into counter repeat_counter.

At step 90, address generator 16 provides a new signal add_int to arbiter 20 equal to the content of memory repeat_label. The method carries on at step 34.

If, at step 86, counter repeat_counter is not at zero, the method carries on at step 92.

At step 92, address generator 16 decrements the content of counter repeat_counter.

At step 94, address generator 16 determines whether counter repeat_counter is at zero. If not, the method carries on at step 90. If so, the method carries on at step 96.

At step 96, address generator 16 increments the read address and provides a new signal add_int to arbiter 20 and the method carries on at step 34.

Figure 10:
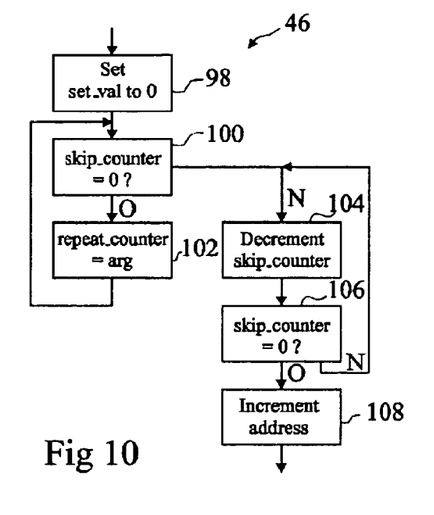

FIG. 10 illustrates the steps of secondary process 46 associated with instruction SKIP.

At step 98, decoding unit 14 sets signal set_val to 0. Signal out provided by buffer unit 18 thus corresponds to the last signal arg stored by buffer unit 18.

At step 100, address generator 16 determines whether counter skip_counter is at zero. If so, the method carries on at step 102.

At step 102, address generator 16 writes signal arg (or only the "wanted" bits thereof) into counter skip_counter. The method carries on at step 100.

If at step 102, counter skip_counter is not at zero, the method carries on at step 104.

At step 104, address generator 16 decrements the content of counter skip_counter.

At step 106, address generator 16 determines whether counter skip_counter is at zero. If not, the method carries on at step 104. If so, the method carries on at step 108.

At step 108, address generator 16 increments the read address and provides a new signal add_int to arbiter 20 and the method carries on at step 34.

Figure 11:
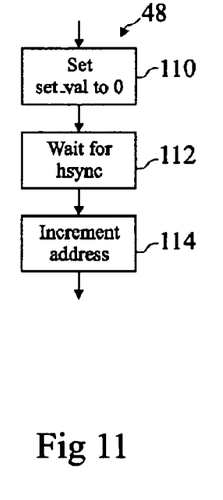

FIG. 11 illustrates the steps of secondary method 48 associated with instruction STOP.

At step 110, decoding unit 14 sets signal set_val to 0. Signal out provided by buffer unit 18 thus corresponds to the last signal arg stored by buffer unit 18.

At step 112, address generator 16 is inactive until reception of signal hsync. On reception of signal hsync, the method carries on at step 114.

At step 114, address generator 16 increments the read address and provides a new signal add_int to arbiter 20 and the method carries on at step 34.

Figure 12:
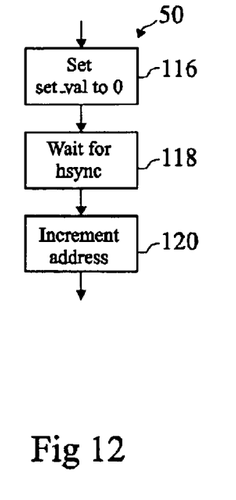

FIG. 12 illustrates the steps of secondary process 50 associated with instruction HOLD.

At step 116, decoding unit 14 sets signal set_val to 0. Signal out provided by buffer unit 18 thus corresponds to the last signal arg stored by buffer unit 18.

At step 118, address generator 16 is inactive until reception of signal vsync. On reception of signal vsync, the method carries on at step 120.

At step 120, address generator 16 increments the read address and provides a new signal add_int to arbiter 20 and the method carries on at step 34.

The processing of an instruction JUMP is performed differently. Signal generator 10 comprises a state machine which, when signal out remains constant, that is, when signal set_val is set to 0 on execution of one of secondary processes 46, 48, or 50, scans the instructions stored in memory 12 for the next instruction JUMP. When an instruction JUMP is detected, the state machine stores, in memory jump_from, the read address for which a jump must be performed and, in memory jump_to, the read address to which the jump must be performed. When the read address provided by the execution of one of secondary processes 36, 38, 40, 42, 44, 48, and 50 corresponds to the read address stored in memory jump_from, the read address is replaced at once by the read address stored in memory jump_to. The state machine then starts scanning again the instructions stored in memory 12 to search for the next instruction JUMP.

The used memory 12 may be a single-port RAM. It may also be a memory formed of flip-flops. This means that the data data_in written into memory 12 are systematically present at the level of signals op_code and arg at the output of memory 12. Thereby, precautions must be taken if write operations are desired to be performed in memory 12 while signal generator 10 is in operation. Indeed, in a write operation, signals op_code and arg provided by memory 12 do not correspond to a read instruction and must not be taken into account by decoding unit 14 and by address generator 16. For this purpose, the present invention provides use of signal ram_access_ok. When signal ram_access_ok is equal to logic value "0", this means that write operations in memory 12 are not authorized. Arbiter 20 then does not take into account possible write requests transmitted by interface unit 22. When signal ram_access_ok is equal to logic value "1", this means that write operations into memory 12 are authorized. Arbiter 20 can then accept a possible write request transmitted by interface unit 22 and then provide a signal ram_add corresponding to signal add_ext. Address generator 16 sets signal ram_access_ok to "1" when it provides no new read address. Such is the case, for example, on execution of an instruction SKIP as long as counter skip_counter does not reach 0. As long as signal ram_access_ok is at "1", decoding unit 14 does not take into account the signal op_code provided by memory 12 and maintains signals CS and set_val at their last values and address generator 16 does not take into account signal arg provided by memory 12. As soon as address generator 16 must provide a new read address, it sets signal ram_access_ok to "0".

FIGS. 13 to 17 illustrate different circuits implementing signal generator 10 according to the present invention.

Figure 13:
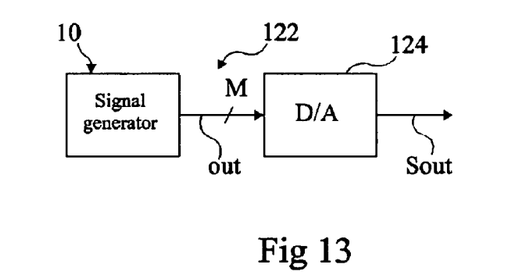
FIGS. 13 to 17 show examples of circuits comprising the signal generator according to the present invention.

FIG. 13 shows an example of a circuit 122 capable of providing an analog signal Sout. Circuit 122 comprises signal generator 10 according to the present invention which provides digital signal out to a digital-to-analog converter 124 (D/A). Converter 124 provides an analog signal Sout corresponding to the conversion of digital signal out. Such an assembly thus enables provision of an analog signal of any form.

Figure 14:
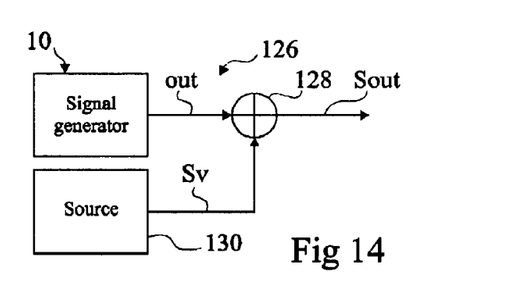

FIG. 14 shows an example of a circuit 126 in which signal out provided by signal generator 10 according to the present invention is added, via an adder 128, to a digital signal Sv provided by a source of signals 130, for example, a video signal source. Digital signal Sout then corresponds to the sum of signals out and Sv.

Figure 15:
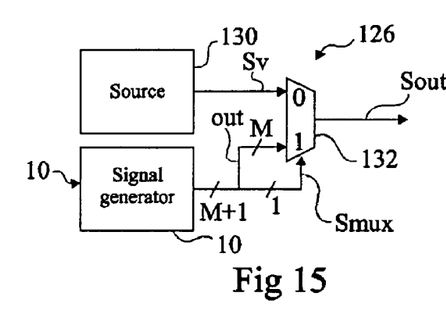

FIG. 15 shows a variation of circuit 126 in which signal Sv is provided to a first input of a multiplexer 132 and signal out is provided to a second input of multiplexer 132. Multiplexer 132 provides signal Sout which is equal to signal Sv and to signal out. Multiplexer 132 is controlled by a control signal Smux which for example corresponds to the most significant bit of signal out. In the present example, signal Sout is equal to signal out only when signal Smux corresponds to logic value "1". Signal Smux may correspond to an additional bit added to signal out and used only for the control of multiplexer 132.

Figure 16:
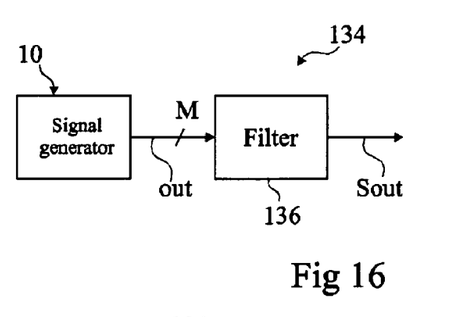

FIG. 16 shows an example of a circuit 134 in which signal generator 10 according to the present invention provides digital signal out to a digital filter 136 which provides signal Sout. As an example, digital filter 136 is a low-pass filter. Such a circuit is particularly advantageous when a signal Sout having "stepped" transitions between two stages is desired to be obtained, which after digital-to-analog conversion, becomes a "smooth"-slope signal. Indeed, filter 136 enables obtaining such "stepped" transitions when signal out corresponds to a signal with abrupt edges. The number of instructions to be provided to obtain such a signal out with abrupt edges is then decreased with respect to the number of instructions which would be necessary to directly obtain signal out having stepped transitions. This enables decreasing the size of memory 12.

Figure 17:
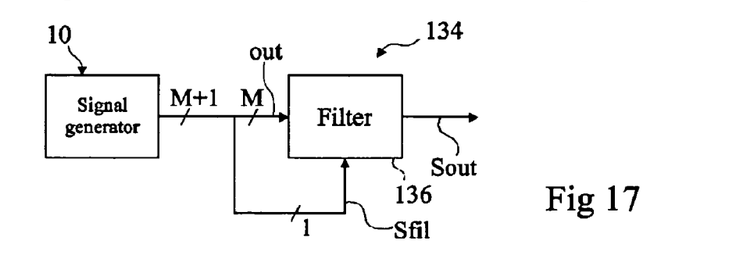

FIG. 17 shows a variation of the circuit of FIG. 16 in which filter 136 is activated by a signal Sfil, which for example corresponds to the most significant bit of signal out. When filter 136 is deactivated, no filtering operation is performed and signal Sout is equal to signal out. Signal Sfil then corresponds to an additional bit added to signal out and only used for the control of filter 136. Such a variation enables only activating filter 136 at the level of some determined portions of signal out. According to another variation, filter 136 can perform two different filtering operations, the first one when signal Sfil has logic value "1" and the second one when signal Sfil has logic value "0".

The present invention comprises many advantages:

first, it enables provision of digital signals (or analog, after conversion) of any waveforms, the only limitation being the dimensions of the memory in which the instructions which describe the desired signal are stored;

second, it enables taking into account redundancies and the portions at constant level almost always present in the signals generally used in electronics, thus limiting the number of instructions necessary to the description of a signal and enabling decreasing the memory dimensions with respect to a memory where all the values of the desired signal would be stored; and third, it enables very easily modifying the provided signal by only modifying the instructions contained in the memory.

Of course, the present invention is likely to have various alterations, modifications, and improvements which will readily occur to those skilled in the art. In particular, the circuits shown in FIGS. 13 to 17 may be combined. As an example, signal out provided by the signal generator according to the present invention may undergo a digital filtering, then be added to another digital signal, and finally be converted into an analog signal.

Such alterations, modifications, and improvements are intended to be part of this disclosure, and are intended to be within the spirit and the scope of the present invention. Accordingly, the foregoing description is by way of example, only and is not intended to be limiting. The present invention is limited only as defined in the following claims and the equivalents thereto.

What is claimed is:

1. A generator of a first signal comprising:
a memory in which instructions are stored, each instruction comprising a code portion and an argument portion;
means for successively reading instructions stored in the memory;
decoding means configured to receive, for each read instruction, the code portion of the instruction and of providing an activation signal which depends on the code portion; and
means for providing said first signal configured to receive, for each read instruction, the argument portion of the instruction and configured, according to the activation signal having a first value, to store the argument portion and to provide said first signal equal to the argument portion and configured, according to the activation signal having a second value, to provide said first signal equal to a most recently stored argument portion, wherein the means for providing said first signal comprises:
a multiplexer controlled by the activation signal and configured to receive, at a first input, the argument portion of the read instruction and, at the second input, said first signal; and
an additional memory connected to the output of the multiplexer and providing said first signal,
wherein the instructions are stored in the memory at locations each associated with an address, the generator comprising address provision means, read means configured to successively read the instructions stored at the locations associated with the addresses, the decoding means configured to, for each read instruction, provide the address provision means with control signals which depend on the code portion of the read instruction, the address provision means configured to provide the next address according to the control signals, and configured to receive at least one event signal generated outside the generator and, for determined control signals, configured to provide the next address when the at least one event signal is at a first value.

2. The generator of claim 1, wherein the memory is a single-port RAM and wherein the address provision means are configured to provide a write authorization signal which depends on the control signals, the generator comprising means for providing at least one write address and one instruction to be written and arbitration means configured to receive the authorization signal and the write address and configured to authorize an operation of writing of the instruction to be written into the memory at a write location associated with the write address when the authorization signal is at an authorization value.

3. The generator of claim 2, wherein the decoding means is configured to receive the authorization signal and configured to ignore the code portion of the instruction to be written when the authorization signal is at the authorization value.

4. A method of providing a first signal by a generator comprising a memory in which are stored instructions, each instruction comprising a code portion and an argument portion, said method comprising:
successively reading instructions from the memory;
providing, for each read instruction, an activation signal which depends on the code portion of the read instruction; and
according to the activation signal having a first value, storing the argument portion of the read instruction and providing said first signal equal to the argument portion and according to the activation signal having a second value, providing said first signal equal to a most recently stored argument portion,
wherein the instructions are stored in the memory at locations each associated with an address, the method comprising a repeating of:
providing an address;
reading the instruction from the memory at the location associated with the address;
providing, for each read instruction, control signals which depend on the code portion of the read instruction; and
determining the next address to be provided according to the control signals, the address being provided on reception of at least one video synchronization signal at a first value, the at least one video synchronization signal being received from outside the generator.

5. The method of claim 4, further comprising, for each read instruction:
providing an authorization signal based on the code portion of the read instruction; and
authorizing an operation of writing into the memory when the authorization signal is at an authorization value.

6. A generator of a first signal comprising:
a memory in which instructions are stored, each instruction comprising a code portion and an argument portion;
means for successively reading instructions stored in the memory;
decoding means configured to receive, for each read instruction, the code portion of the instruction and configured to provide an activation signal which depends on the code portion; and
means for providing said first signal configured to receive, for each read instruction, the argument portion of the instruction and configured, according to the activation signal having a first value, to store the argument portion and to provide said first signal equal to the argument portion and configured, according to the activation signal having a second value, to provide said first signal equal to a most recently stored argument portion, wherein the instructions are stored in the memory at locations each associated with an address, the generator comprising address provision means, means configured to successively read the instructions stored at the locations associated with the addresses, the decoding means configured, for each read instruction, to provide the address provision means with control signals which depend on the code portion of the read instruction, the address provision means configured to provide the next address according to the control signals, and wherein the memory is a single-port RAM and wherein the address provision means are configured to provide a write authorization signal which depends on the control signals, the generator comprising means for providing at least one write address and one instruction to be written and arbitration means configured to receive the authorization signal and the write address and configured to authorize an operation of writing of the instruction to be written into the memory at the location associated with the write address when the authorization signal is at an authorization value, the decoding means configured to receive the authorization signal and configured to ignore the code portion of the instruction to be written when the authorization signal is at the authorization value.

7. A signal generator that generates an output signal based on at least one instruction, the signal generator comprising:
a memory that stores the at least one instruction;
an address provision unit that receives at least one video synchronization signal from outside the signal generator and provides an address to the memory in response to the at least one video synchronization signal; and
an output buffer that generates the output signal based on the at least one instruction.

8. The signal generator of claim 7, wherein the at least one video synchronization signal comprises an hsync signal and a vsync signal.

9. The signal generator of claim 7, wherein the at least one video synchronization signal comprises a first event signal and a second event signal.

10. The signal generator of claim 7, further comprising:
an instruction decoder that decodes the at least one instruction to provide a control signal to the output buffer.

11. The signal generator of claim 10, wherein, when the control signal is at a first value, the output buffer is controlled to hold a value of the output value at the same value.

12. The signal generator of claim 7, wherein the address provision unit comprises:
an address generator that receives the at least one event signal; and
an arbiter that provides the address to the memory.

13. A method for generating an output signal using a signal generator, the method comprising:
receiving at least one synchronization signal from outside the signal generator;
receiving at least one instruction;
generating an address in response to the at least one synchronization signal, and providing the address to a memory;
storing the at least one instruction in the memory at the address;
decoding the at least one instruction; and
generating an output signal based on the at least one instruction;
wherein the at least one synchronization signal comprises an hsync signal and a vsync signal.

14. The method of claim 13, further comprising maintaining the output signal at a same value in response to decoding the at least one instruction, the at least one instruction indicating that the output signal is to be maintained at the same value.

15. The method of claim 13, wherein the output signal comprises video synchronization pulses.

* * * * *

UNITED STATES PATENT AND TRADEMARK OFFICE
CERTIFICATE OF CORRECTION

| | |
|---|---|
| PATENT NO. | : 8,166,283 B2 |
| APPLICATION NO. | : 11/502343 |
| DATED | : April 24, 2012 |
| INVENTOR(S) | : Xavier Cauchy |

It is certified that error appears in the above-identified patent and that said Letters Patent is hereby corrected as shown below:

IN THE SPECIFICATIONS:

Column 7, line 28, should read:
read address when it provides a new read address which designates Signed and Sealed this
Twenty-ninth Day of May, 2012

David J. Kappos
*Director of the United States Patent and Trademark Office*